United States Patent
Ewen

(10) Patent No.: US 9,753,073 B2
(45) Date of Patent: Sep. 5, 2017

(54) METHOD AND SYSTEMS FOR TESTING AN ELECTRICAL CIRCUIT

(71) Applicant: General Electric Company, Schenectady, NY (US)

(72) Inventor: John Douglas Ewen, Topeka, KS (US)

(73) Assignee: General Electric Company, Schenectady, NY (US)

(*) Notice: Subject to any disclaimer, the term of this patent is extended or adjusted under 35 U.S.C. 154(b) by 129 days.

(21) Appl. No.: 14/948,563

(22) Filed: Nov. 23, 2015

(65) Prior Publication Data
US 2017/0146580 A1    May 25, 2017

(51) Int. Cl.
G01R 31/02    (2006.01)
G01R 31/00    (2006.01)
H01R 25/00    (2006.01)

(52) U.S. Cl.
CPC .......... *G01R 31/006* (2013.01); *G01R 31/02* (2013.01); *H01R 25/006* (2013.01); *H01R 2201/26* (2013.01)

(58) Field of Classification Search
CPC .... G01R 31/00; G01R 31/005; G01R 31/006; G01R 31/008; G01R 31/02; G01R 31/021; G01R 31/023; H01R 25/00; H01R 25/006
USPC ....... 324/500, 503, 537, 539, 541, 551, 555; 702/108, 117, 118, 120; 361/600, 826; 439/34, 35
See application file for complete search history.

(56) References Cited

U.S. PATENT DOCUMENTS

| | | | |
|---|---|---|---|
| 5,177,447 A | 1/1993 | Marino et al. | |
| 5,465,010 A | 11/1995 | Rimmer | |
| 5,471,741 A | 12/1995 | Heisner et al. | |
| 6,397,609 B1* | 6/2002 | Shikata | B60H 1/00514 361/701 |
| 6,494,174 B1 | 12/2002 | Daly | |
| 7,368,919 B2 | 5/2008 | Gervais | |
| 7,952,360 B2 | 5/2011 | Ganesh | |
| 8,103,475 B2 | 1/2012 | Sorensen | |
| 2003/0062191 A1* | 4/2003 | Miller | H01R 4/2433 174/176 |
| 2004/0021471 A1* | 2/2004 | Ngo | G01R 31/02 324/548 |
| 2007/0001683 A1 | 1/2007 | Krigel | |

(Continued)

OTHER PUBLICATIONS

Ong et al.,"Assembly times for electrical connections and wire harnesses",The International Journal of Advanced Manufacturing Technology, vol. 6, Issue: 2,pp. 155-179, May 1991.

*Primary Examiner* — Hoai-An D Nguyen
(74) *Attorney, Agent, or Firm* — Global Patent Operation; John A. Kramer

(57) ABSTRACT

Various methods and systems are provided for an electrical testing apparatus for an electrical panel and associated wiring harness. In one embodiment, an electrical testing apparatus includes a common housing; a first connector tethered to the housing via a first plurality of wires extending away from and coupled within the housing, where the first connector is adapted to connect to an electrical panel; a second connector mounted to the housing and adapted to connect to a wiring harness of the electrical panel, the wiring harness including a second plurality of wires; and a third connector mounted to the housing and including a plurality of test points for testing an electrical signal passing through each wire of the second plurality of wires.

21 Claims, 8 Drawing Sheets

(56) References Cited

U.S. PATENT DOCUMENTS

| | | | |
|---|---|---|---|
| 2008/0090469 A1* | 4/2008 | Owen | B60R 16/0207 |
| | | | 439/699.2 |
| 2010/0041510 A1* | 2/2010 | Gladd | H01R 13/514 |
| | | | 475/331 |
| 2013/0048366 A1* | 2/2013 | O'Neil | H02G 15/117 |
| | | | 174/350 |
| 2013/0221982 A1 | 8/2013 | Julson et al. | |
| 2013/0230996 A1* | 9/2013 | Klein | H01R 13/533 |
| | | | 439/271 |

* cited by examiner

METHOD AND SYSTEMS FOR TESTING AN ELECTRICAL CIRCUIT

BACKGROUND

Technical Field

Embodiments of the subject matter disclosed herein relate to systems for testing electrical circuits.

Discussion Of Art

Electrical systems may include one or more wiring harnesses used to transfer multiple separate electrical signals to and from electrical components. Specifically, a wiring harness is a group of wires that are bundled together in order to simplify their handling and routing. Although bundling wires together into a group makes the process of handling them collectively easier, it also makes inspection and repair of individual wires within the bundle more difficult. In addition, because the wires are bundled together, the wires in the wiring harness are subject to rubbing and chafing during vibration or other physical loading, which can lead to degradation in the wire, and ultimately a loss of performance. Monitoring the wires within a wiring harness is desirable to detect faults as they develop, and before they become severe enough that the signal being carried by a wire is lost entirely.

Various techniques have been used to test the integrity of wiring harnesses, including visual inspection. However, in some circumstances, much of the wiring is not available for visual inspection without significantly dismantling the harnesses. As another example, the wiring harness or connector to which the wiring harness is coupled may be back-probed with a small conductive probe, such as a screw driver or paper clip. However, individually back-probing multiple wire connections of the wire harness may be confusing and may also degrade the wiring harness since the probe may split the insulation wiring or damage the connector.

BRIEF DESCRIPTION

In an embodiment, an electrical testing apparatus includes a common housing, and a first connector tethered to the housing via a first plurality of wires extending away from and coupled within the housing. The first connector is adapted to connect to an electrical panel. The apparatus further includes a second connector mounted to the housing and adapted to connect to a wiring harness of the electrical panel. The wiring harness includes a second plurality of wires.

The apparatus further includes a third connector mounted to the housing and including a plurality of test points for testing an electrical signal passing through each wire of the second plurality of wires. In this way, the electrical testing apparatus may be used to detect electrical signals passing though wires of the wiring harness.

DETAILED DESCRIPTION

The following description relates to embodiments of an electrical testing apparatus. The electrical testing apparatus may include a common housing and a first connector tethered to the housing via a first plurality of wires extending away from and coupled within the housing, where the first connector is adapted to connect to an electrical panel. The electrical panel may be an electrical panel of an electrical system. The electrical system may include multiple panel connectors (e.g., ports) and one or more electrical circuits within the electrical panel and coupled to the panel connectors. In one example, the electrical system is an electrical system of a vehicle. The electrical testing apparatus may further include a second connector mounted to the housing and adapted to connect to a wiring harness of the electrical panel, the wiring harness including a second plurality of wires. As one example, the wiring harness includes a bundle of multiple wires and the wiring harness is adapted to couple to a panel connector of the electrical panel. Additionally, the electrical testing apparatus may include a third connector mounted to the housing and including a plurality of test points for testing an electrical signal passing through each wire of the second plurality of wires. In this way, electrical signals passing through the wiring harness to/from the electrical panel may be assessed and degradation of one or more wires of the wiring harness may be detected.

Figure 1:
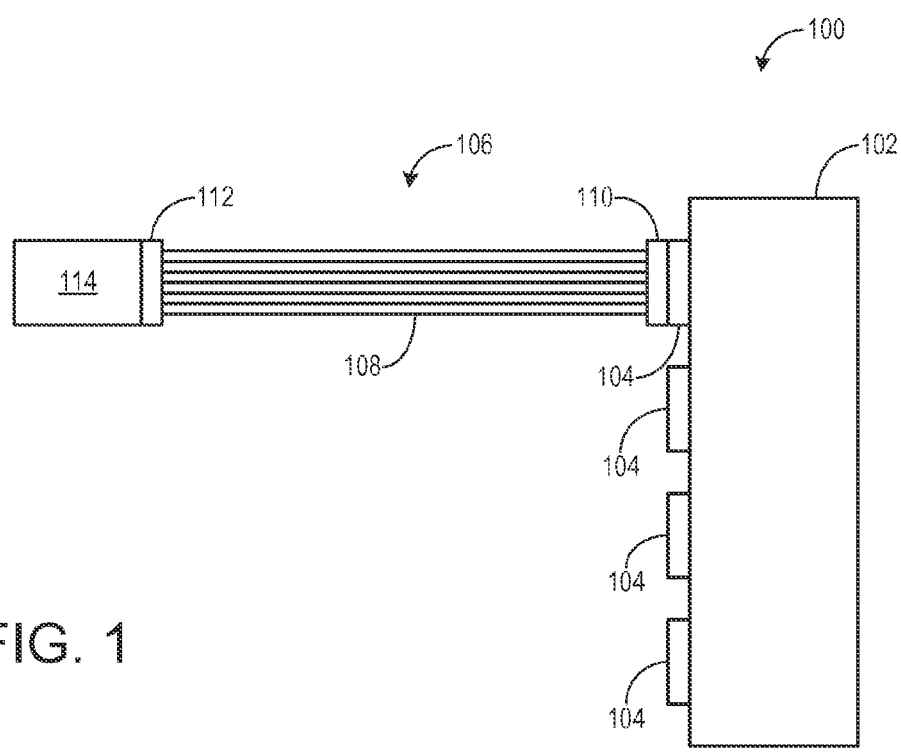
FIG. 1 shows a schematic view of an electrical panel and associated wiring harness according to an embodiment of the invention.
Figure 2:
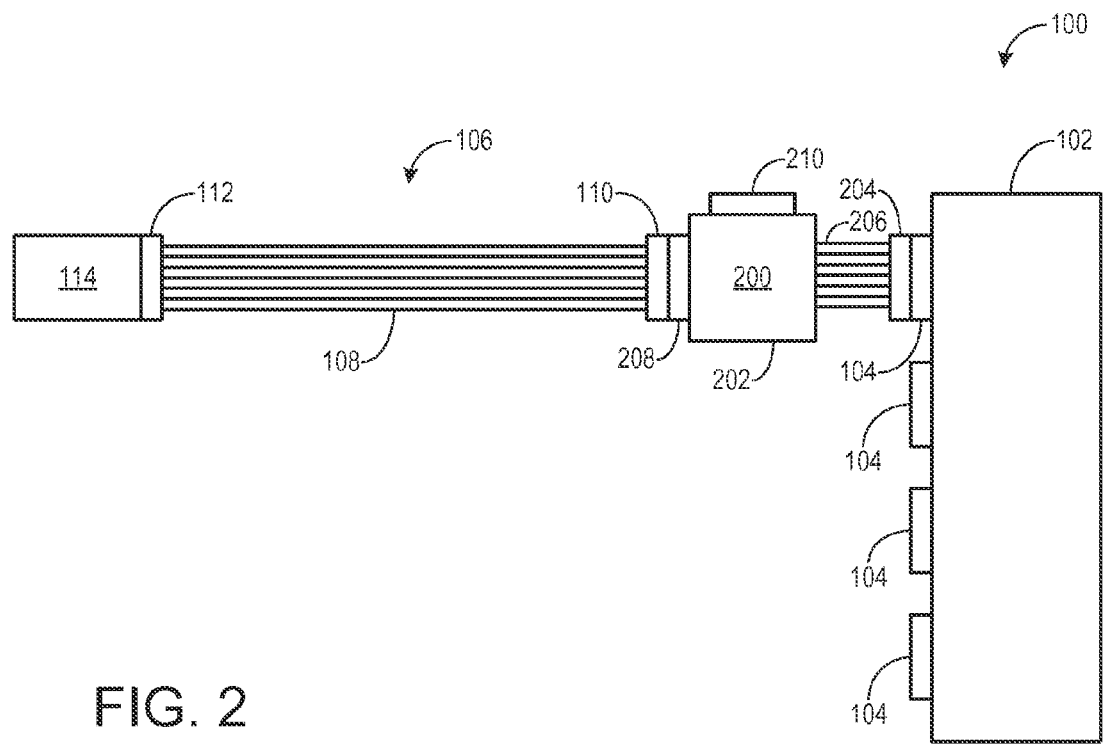
FIG. 2 shows a schematic view of an electrical testing apparatus coupled to the electrical panel and associated wiring harness according to an embodiment of the invention.
Figure 3:
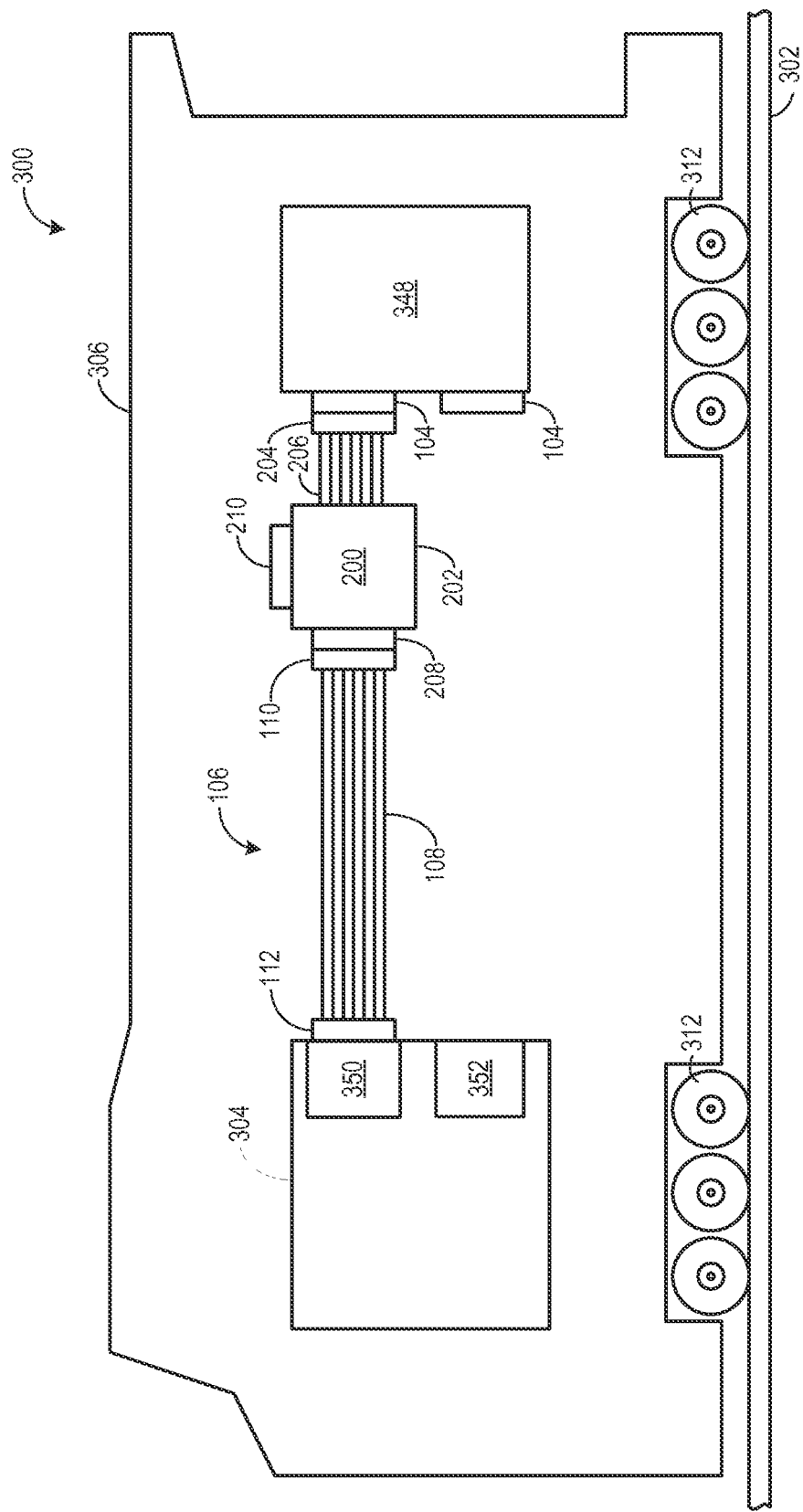
FIG. 3 shows a schematic view of a vehicle including an engine and an electrical testing apparatus coupled to an electrical panel of the locomotive according to an embodiment of the invention.
Figure 8:
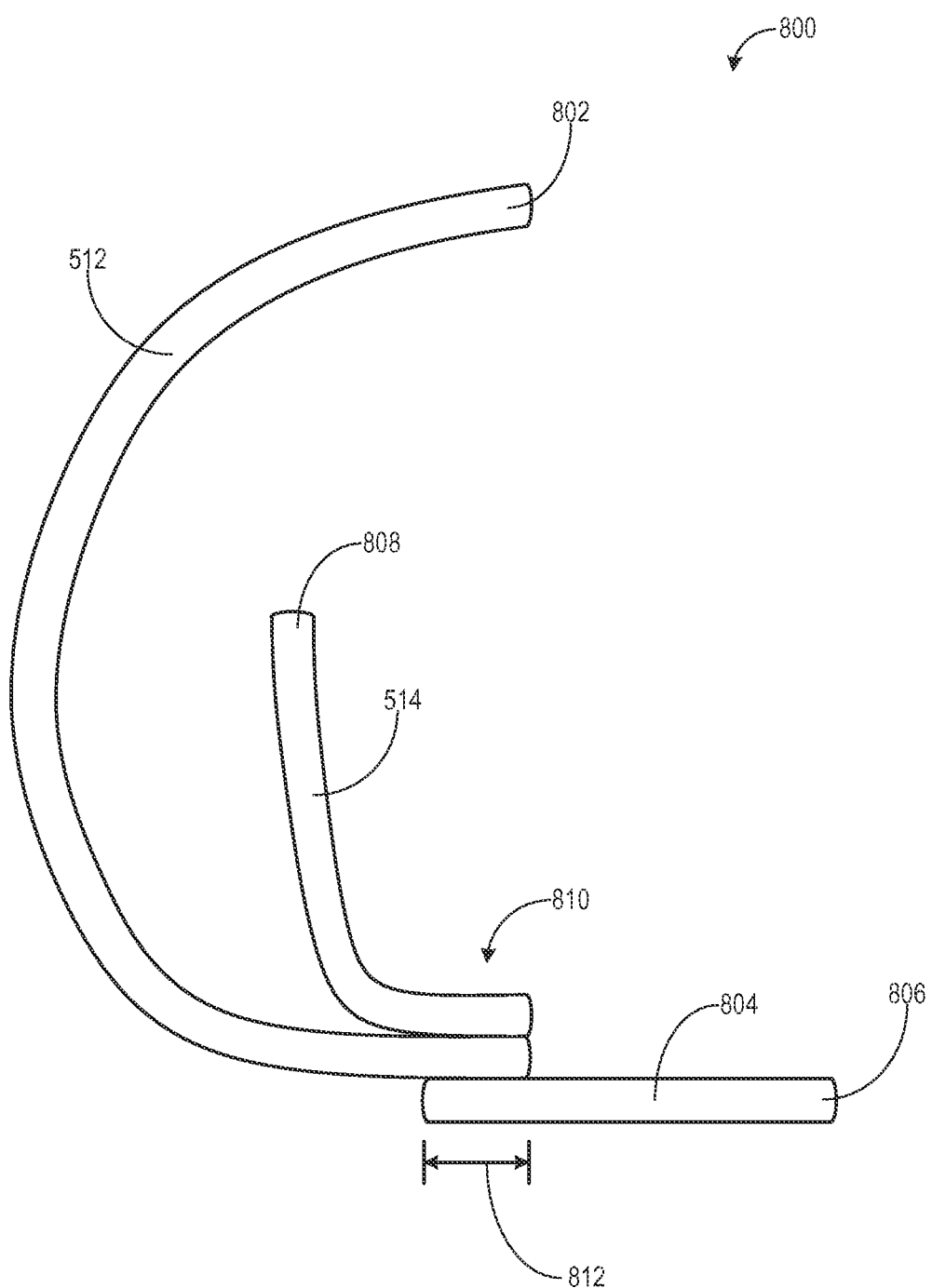
FIG. 8 shows a wire configuration of wires of the electrical testing apparatus according to an embodiment of the invention.
Figure 9:
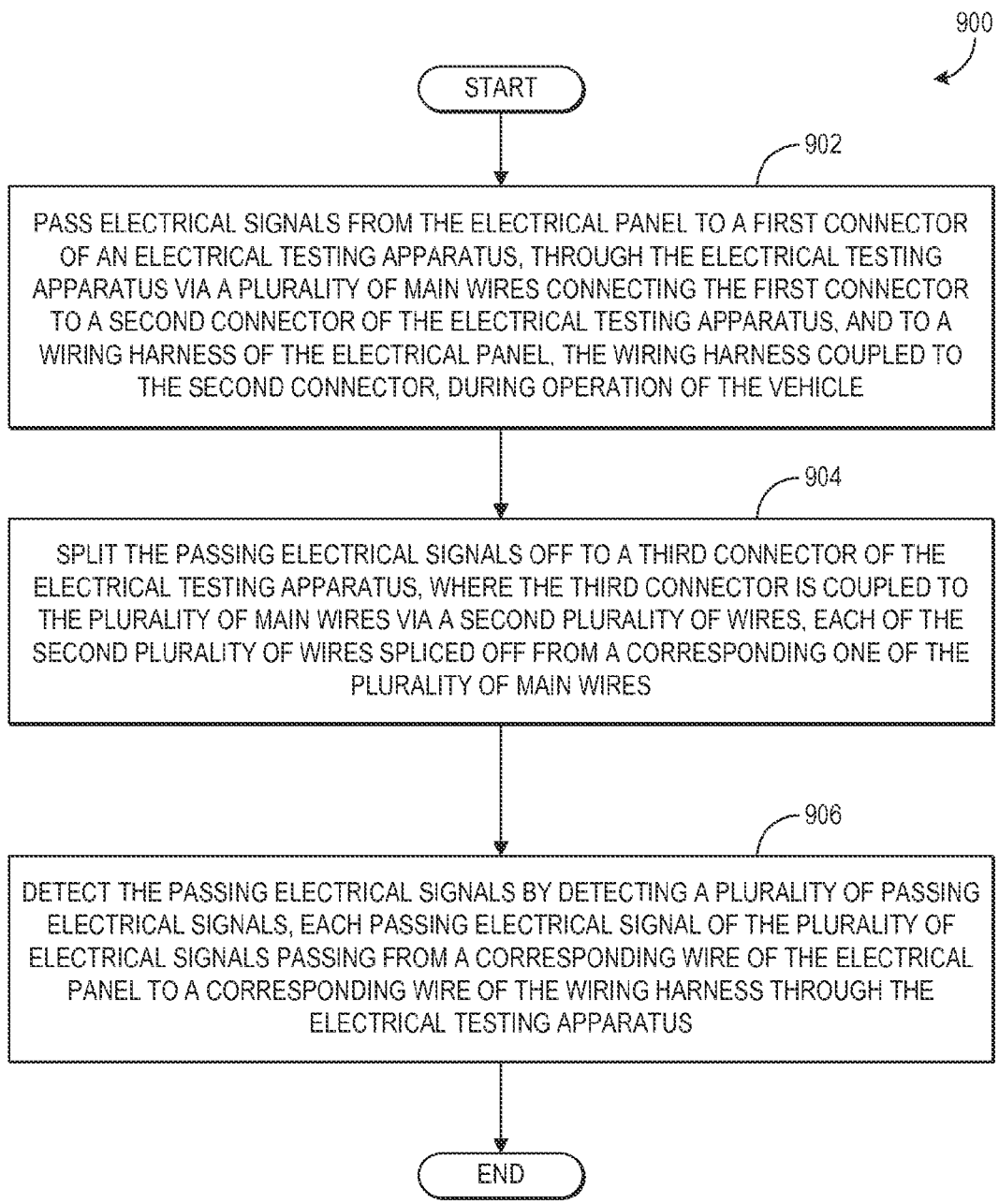
FIG. 9 shows a flow chart of a method for monitoring an electrical panel of a vehicle according to an embodiment of the invention.

FIG. 1 shows an embodiment of an electrical system including a wiring harness coupled directly to an electrical panel. When electrical testing of the wiring harness and/or circuits of the electrical panel is desired, an electrical testing apparatus may be connected in series with the electrical panel and wiring harness, as shown in FIG. 2. In one embodiment, the electrical panel may be installed in a vehicle, such as a locomotive, as shown in FIG. 3. Further, in one embodiment, the electrical panel may be an engine control unit (ECU) of the vehicle. FIGS. 4-7 show an embodiment of an electrical testing apparatus including three connectors for connecting to the electrical panel, wiring harness, and an external electrical testing probe of a testing device. FIG. 8 shows an embodiment of a wire configuration of each of the wires of the electrical testing apparatus. Additionally, FIG. 9 presents a method for monitoring an electrical panel of a vehicle using an electrical testing apparatus, such as the electrical testing apparatus shown in FIGS. 4-8.

In one embodiment, the approach described herein may be employed in a variety of systems, some of which may be engine-driven systems. Some of these systems may be stationary, while others may be on semi-mobile or mobile platforms. Semi-mobile platforms may be relocated between operational periods, such as mounted on flatbed trailers. Mobile platforms include self-propelled vehicles. Such vehicles can include on-road transportation vehicles, as well as mining equipment, marine vessels, rail vehicles, and other off-highway vehicles (OHV). For clarity of illustration, a locomotive is provided as an example of a mobile platform supporting a system incorporating an embodiment of the invention and/or in regards to which an embodiment of the invention may be used.

Before further discussion of the electrical testing apparatus, an example of a system in which the electrical testing apparatus may be installed for performing electrical testing is shown. Specifically, FIG. 1 shows a schematic of an electrical system 100 including an electrical panel 102. The electrical panel may include one or more panel connectors 104 that each has a plurality of wire connections. For example, as shown in FIG. 1, the electrical panel includes four panel connectors with multiple wire connections for each panel connector. Specifically, each wire connection of each panel connector is coupled to an electrical wire within the electrical panel. As one example, each panel connector may include 62 wire connections for coupling to 62 electrical wires of a circuit within the electrical panel. As another example, each panel connector may include 37 wire connections for coupling 37 electrical wires of a circuit within the electrical panel. All the electrical wires within the electrical panel may be coupled to one or more electrical circuits within the electrical panel and may perform different control functions or couple to an electronic controller that sends and/or receives electrical signals via the wires.

As shown in FIG. 1, a wiring harness 106 is directly and electrically coupled to one of the panel connectors of the electrical panel. The wiring harness comprises a plurality (e.g., grouping) of harness wires 108 bundled together in order to simplify their handling and routing. The number of harness wires 108 is equal to the number of wire connections of the panel connector (e.g., which, in one example, may be 62). As such, each harness wire of the wiring harness corresponds to and couples to one wire connection of the panel connector (and thus the corresponding one electrical wire within the electrical panel that is connected to the one wire connection). As shown in FIG. 1, a first harness connector 110 of the wiring harness directly couples to one panel connector of the electrical panel. In this way, electrical signals from wires of the electrical panel may pass through the coupled panel connector and first harness connector and into the harness wires of the wiring harness. The wiring harness includes a second harness connector 112 that is coupleable to a corresponding number of multiple wires of one or more additional electrical components 114 (e.g., such as sensors, actuators, or alternate control mechanisms that send and/or receive signals via the wires of the wiring harness to and/or from the electrical panel).

Although bundling wires together into a wiring harness, as shown in FIG. 1, makes the process of handling them collectively easier, it also makes inspection and repair of individual wires within the bundle more difficult. Monitoring the wires within a wiring harness may be desired to detect faults as they develop, and before they become severe enough that the signal being carried by a wire in the wiring harness is lost entirely. In one embodiment, an electrical testing apparatus, as shown in FIG. 2, may be coupled to the wiring harness to detect signals passing through the wires of the wiring harness and determine degradation of one or more harness wires.

FIG. 2 shows the electrical system 100 of FIG. 1 with an electrical testing apparatus 200 connected in series with the wiring harness 106 and electrical panel 102. The testing apparatus includes three electrical connectors and a housing 202. A first connector 204 is tethered to the housing via a plurality of wires 206 extending away from and coupled within the housing. The first connector is adapted to connect to the panel connector 104 of the electrical panel. For example, the first connector of the testing apparatus may be similar (e.g., have a similar male/female connection configuration) to the first harness connector 110 of the wiring harness and thus the first connector of the testing apparatus is complementary to and adapted to mate with the panel connector of the electrical connector. As such, when the testing apparatus is connected to the panel as shown, an electrical connection is formed between the associated wires of the electrical panel and the corresponding wires of the testing apparatus.

The testing apparatus includes a second connector 208 mounted to the housing and adapted to connect to the wiring harness. Specifically, the second connector of the testing apparatus may be complementary to and adapted to mate with the first harness connector 110 of the wiring harness. As shown in FIG. 2, the second connector of the testing apparatus is directly mounted to the housing of the testing apparatus on an opposite side of the housing from the first connector. The testing apparatus also includes a third connector 210 mounted to the housing. As shown in FIG. 2, the third connector is directly mounted to a top side of the testing apparatus. The top side of the housing of the testing apparatus is perpendicular to the side of the housing to which the second connector is coupled and to the side of the housing to which the first connector is tethered. The third connector includes a plurality of test points for testing an electrical signal passing through each wire of the harness wires 108 of the wiring harness. For example, an external electrical testing apparatus may be coupled to each test point of the third connector to measure one or more electrical signals of the wires (e.g., voltage, impedance, or the like). By coupling the testing apparatus 200 in series with the electrical panel and the wiring harness, electrical signals may continue to pass through the wires of the testing apparatus and wiring harness to/from the electrical panel and from/to the additional electrical component(s) that the wiring harness is coupled to. In this way, testing of the electrical signals passing through the wires may be done in real-time, while the electrical system is operating and without disrupting the functionality of the electrical circuits.

FIG. 3 shows an example of a platform in which the electrical system and testing apparatus may be installed for use in a vehicle, such as a rail vehicle. FIG. 3 shows a block diagram of an embodiment of a vehicle system 300 (e.g., a locomotive system), herein depicted as including a vehicle 306. The illustrated vehicle is a rail vehicle configured to run on a rail 302 via a plurality of wheels 312. As depicted, the vehicle includes an engine system with an engine 304. The engine may receive intake air for combustion from an intake passage (not shown). Exhaust gas resulting from combustion in the engine may be supplied to an exhaust passage (not shown). Exhaust gas flows through the exhaust passage, and out of an exhaust stack of the vehicle.

The vehicle system includes an electrical panel 348 (similar to electrical panel 102 of FIGS. 1-2). The electrical panel includes one or more circuits including a plurality of wires. The electrical panel may be one of a Consolidated Input/Output panel (CIO), a DC Traction Controller (DTC) or other traction controller (e.g., AC traction controller), or an Engine Control Unit (ECU) for the vehicle. The electrical panel is in electronic communication with one or more electronic components of the vehicle via a wiring harness 106. The vehicle may include a plurality of electrical panels. Each electrical panel includes multiple panel connectors 104 with a plurality of wires coupled to each panel connector. As shown in FIG. 3 and described above with regard to FIG. 2, an electrical testing apparatus 200 may be coupled between and in series with the electrical panel and the wiring harness in order to test the electrical signals traveling through the wiring harness to/from the electrical panel. As described above with regard to FIG. 2, the electrical testing apparatus includes three complementary connectors, one complementary connector of the three connectors coupled to one of the panel connector, the first harness connector 110, and an external electrical testing device.

As shown in FIG. 3, the electrical panel may be the ECU including an electronic controller employed to control various components related to the vehicle system. In one example, the controller includes a computer control system including a plurality of circuits. The controller further includes computer readable storage media (not shown) including code for enabling on-board monitoring and control of rail vehicle operation. The controller, while overseeing control and management of the vehicle system, may receive signals from a variety of engine sensors 350 to determine operating parameters and operating conditions, and correspondingly adjust various engine actuators 352 to control operation of the vehicle. For example, the controller may receive signals from various engine sensors including, but not limited to, engine speed, engine load, boost pressure, exhaust pressure, ambient pressure, exhaust temperature, and the like. Correspondingly, the controller may control aspects and operations of the vehicle system by sending commands to various components such as traction motors, alternator, throttle, and the like. As shown in FIG. 3, the wiring harness is coupled between the sensors and the testing apparatus and the testing apparatus is coupled to the electrical panel (in this example, the ECU). Thus, during engine operation when the electrical testing apparatus is installed as shown in FIG. 3, electrical signals pass from the sensors, through the wiring harness, through the electrical testing apparatus, and to the ECU via the panel connector connected to the testing apparatus. These passing electrical signals may then be detected via the third connector 210 of the testing apparatus by an external electrical testing device. A second wiring harness and electrical testing apparatus may be coupled between a second panel connector and a second set of additional electrical components of the vehicle, such as actuators 352. In this way, the electrical testing apparatus may be coupled in series with different wiring harnesses and corresponding panel connectors of electrical panels of the vehicle. When electrical testing in not needed, the electrical testing apparatus may be removed and the wiring harness may be directly coupled to the panel connector via the first harness connector of the wiring harness.

Figure 4:
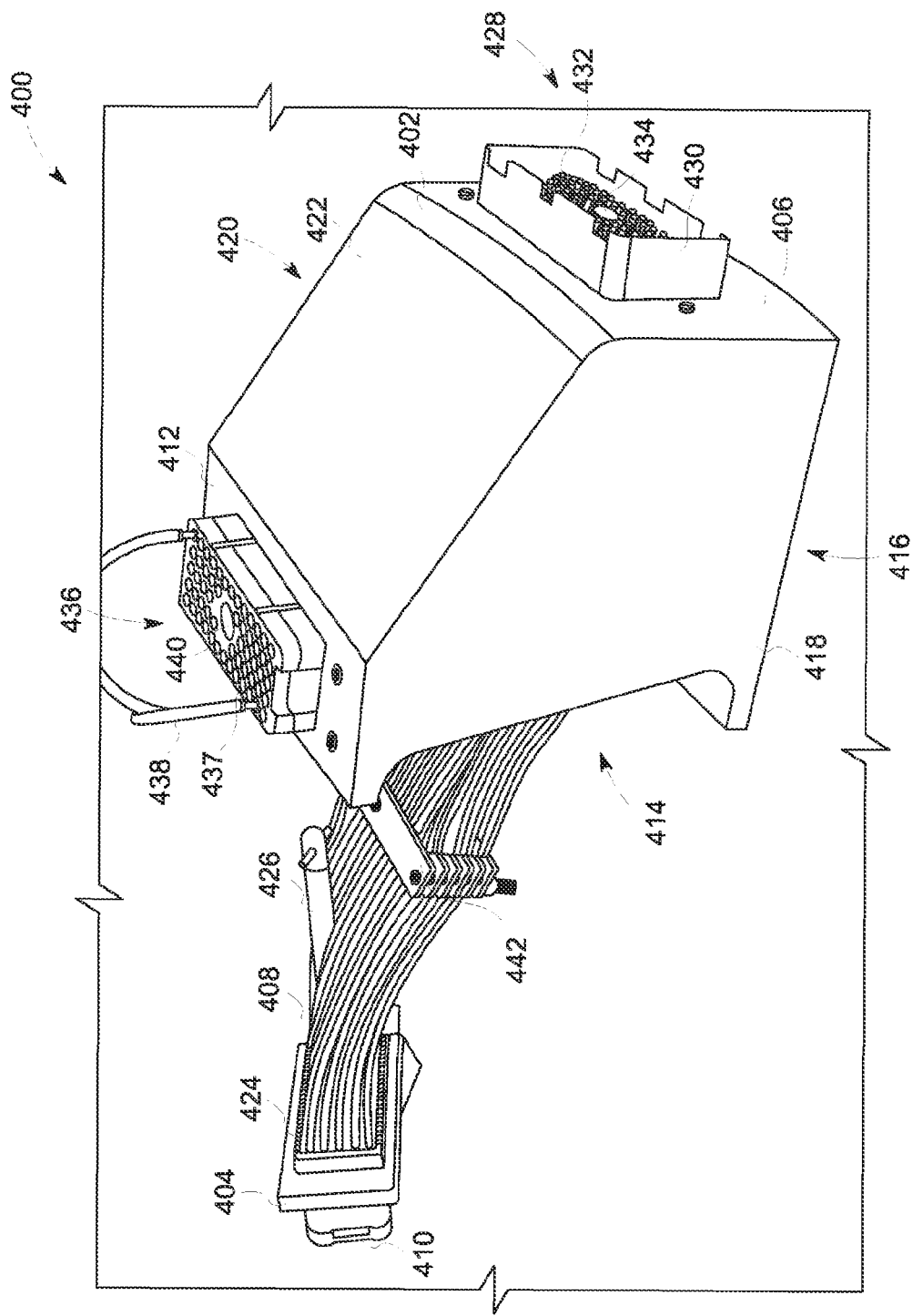
FIG. 4 shows a first isometric view of an electrical testing apparatus according to an embodiment of the invention.
Figure 5:
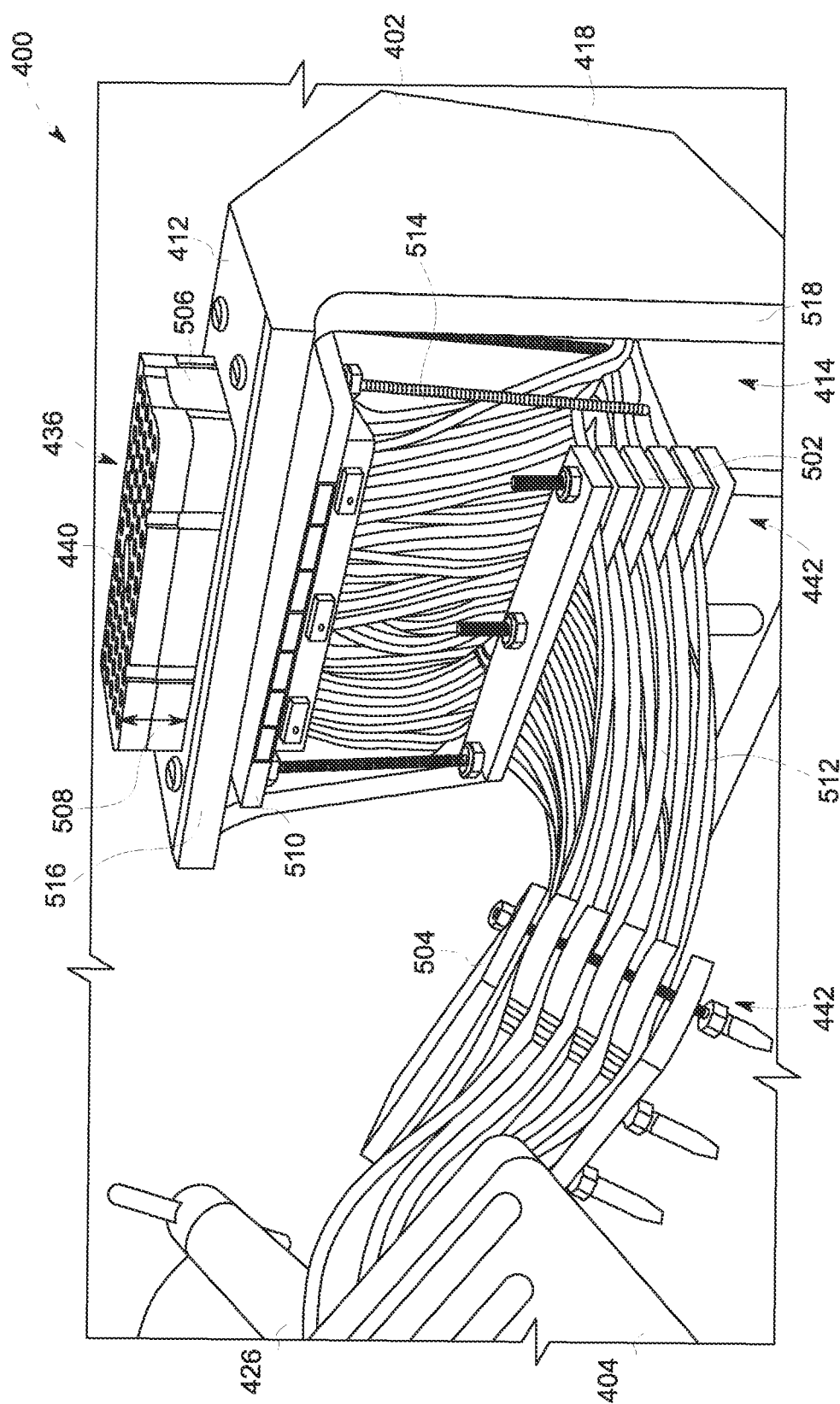
FIG. 5 shows a second isometric view of the electrical testing apparatus according to an embodiment of the invention.
Figure 6:
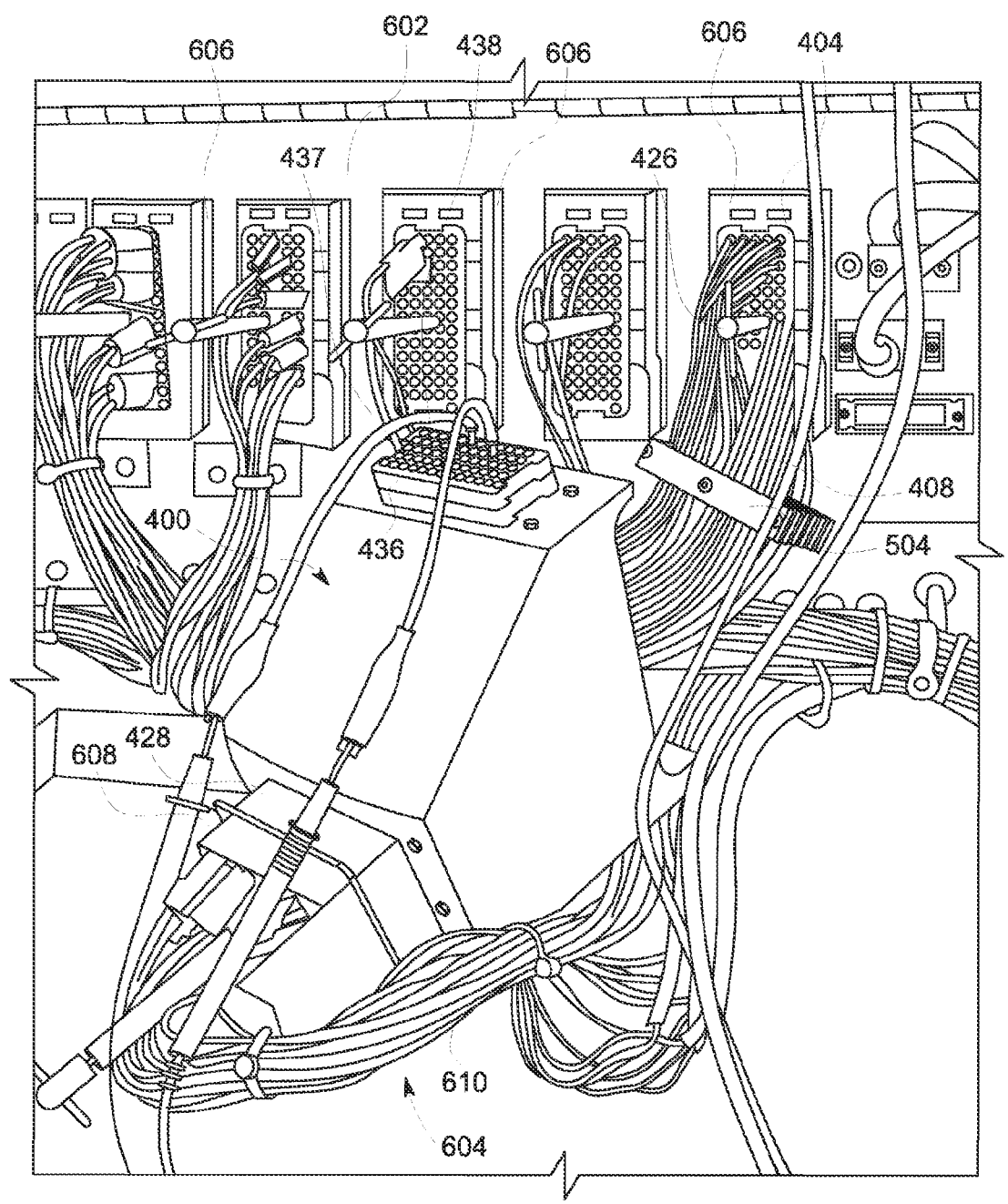
FIG. 6 shows the electrical testing apparatus coupled to an electrical panel according to an embodiment of the invention.
Figure 7:
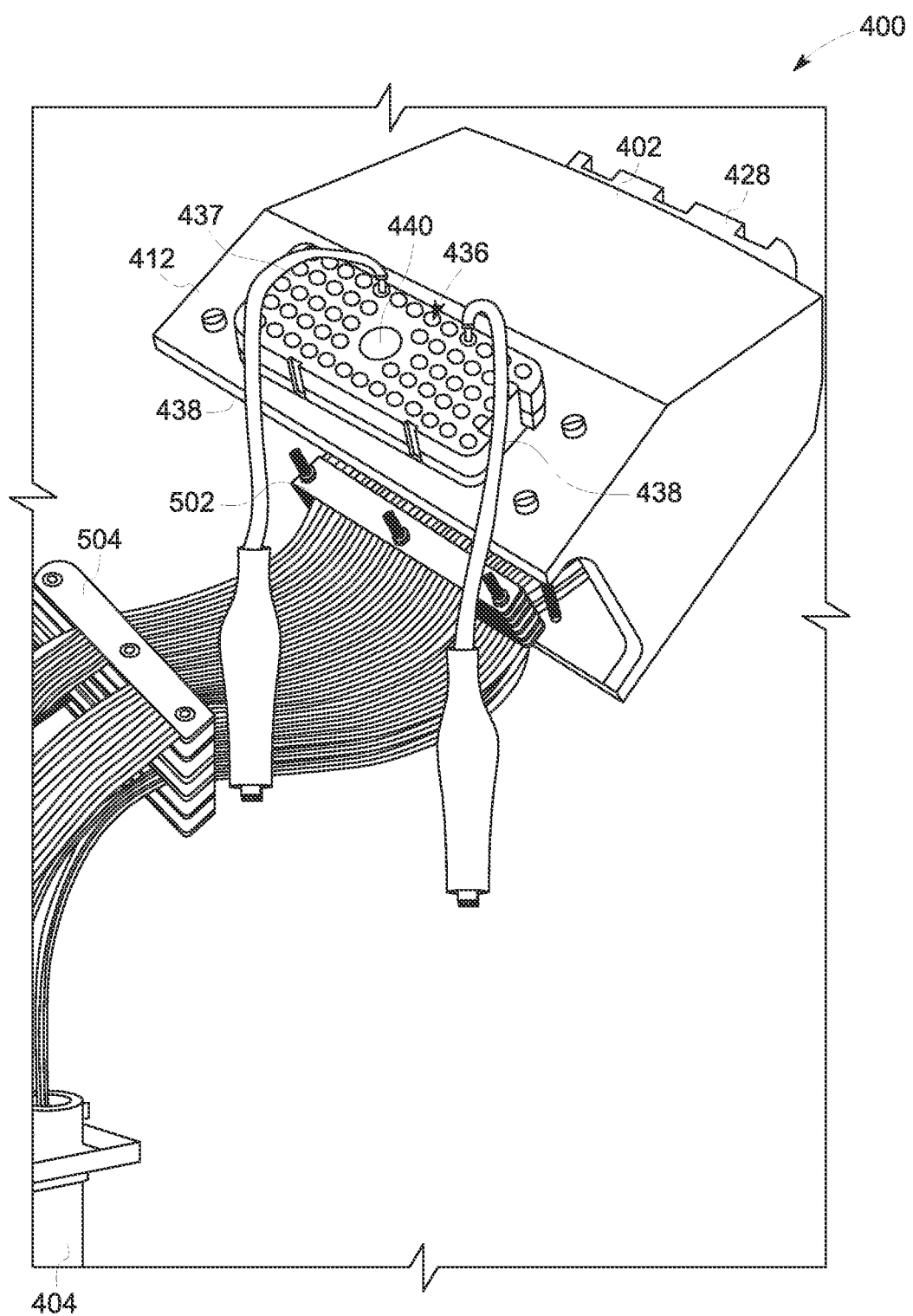
FIG. 7 shows a top view of the electrical testing apparatus according to an embodiment of the invention.

An embodiment of an electrical testing apparatus 400 for testing electrical signals passing through a wiring harness of an electrical panel, such as the testing apparatus 200 shown in FIGS. 1-3, is shown in FIGS. 4-7. FIG. 4 shows a first isometric view of the electrical testing apparatus. FIG. 5 shows a second isometric view of the testing apparatus showing an interior view of an open side of the apparatus. FIG. 6 shows the electrical testing apparatus coupled to an electrical panel (such as the electrical panel 102 shown in FIGS. 1-2 or electrical panel 348 shown in FIG. 3). FIG. 7 shows a top view of the electrical testing apparatus including a plurality of testing ports of the connector. Additionally, a wiring configuration of the wires disposed inside the electrical testing apparatus is shown in FIG. 8. FIGS. 4-7 are drawn approximately to scale.

Turning first to FIG. 4, the testing apparatus includes a common housing 402 enclosing interior components of the testing apparatus, including a plurality of wires coupled between the various connectors of the testing apparatus. As used herein, the common housing is defined as a housing of the testing apparatus to which all electrical connectors of the testing apparatus are either directly mounted to or tethered to via a plurality of wires. As such, each connector (e.g., each of the first, second, and third connectors, as described further below) are coupled to (either directly or indirectly through wires housed within the common housing) the same housing. In this way, the apparatus housing encases the wires of the apparatus to both contain and protect the wires from degradation. A shape of the housing is box-like with planar sidewalls and multiple angled surfaces. As shown in FIG. 4, the housing includes a first sidewall 406 (on a first side of the testing apparatus), a top, second sidewall 412 (on a second side of the testing apparatus), an open, third side 414 (e.g., the third side of the testing apparatus), a bottom, fourth sidewall 416 (on a fourth side of the testing apparatus), a fifth sidewall 418 (on a fifth side of the testing apparatus), a sixth sidewall 420 (on a sixth side of the testing apparatus), and an angled, seventh sidewall 422. A line normal to the face of the seventh sidewall is angled between the second side and first side of the testing apparatus. Further, the seventh sidewall angles downward from the top, second sidewall to the first sidewall, where the first sidewall is perpendicular to the second sidewall, the fifth sidewall, and the sixth sidewall and parallel to the open, third side of the testing apparatus. Thus, the housing is a fully enclosed housing except for the third side which is the single open end of the housing. In an alternate embodiment, the housing may include an alternate number of sidewalls and/or may have a different shape and/or size to contain wires of the testing apparatus within the housing.

The testing apparatus includes three electrical connectors. A first connector 404 is tethered to the third side 414 of the housing via a first plurality of wires 408 extending away from and coupled within the housing. The first plurality of wires extends out of the housing from the single open end at the third side of the housing. As shown in FIG. 4, the first connector is spaced away from and not directly coupled to a wall or surface of the housing. The first connector has first side (e.g., end) 410 adapted to couple to and mate with a complementary panel connector of an electrical panel (e.g., such as panel connector 104 shown in FIGS. 1-3). The first plurality of wires extends from a second side (e.g., end) 424 of the first connector to an interior of the housing, where the second side is opposite the first side of the first connector. Each wire of the first plurality of wires couples to a respective port or pin on the first side of the first connector. Additionally, a metal shaft 426 extends away from the second side of the first connector and toward the housing, along a portion of a length of the first plurality of wires. The metal shaft is adapted to lock the first connector into a panel connector of an electrical panel. For example, the metal shaft may screw into an aperture in the panel connector in order to provide a robust electrical connection between the first connector of the testing apparatus and the panel connector.

A second connector 428 of the testing apparatus is mounted to the first side of the housing. Specifically, the second connector is mounted directly to the first sidewall of the housing, where the first sidewall is opposite the third side of the housing. The second connector is adapted to connect to and mate with a complementary connector of a wiring harness (such as the wiring harness 106 shown in FIGS. 1-3). For example, the second connector includes an exterior frame 430 surrounding a plurality of pins 432. The exterior frame extends outward from an exterior surface of the first sidewall. The corresponding connector of the wiring harness may fit within the exterior frame and each female port of the wiring harness connector may couple to one of the pins of the second connector. As such, a one-to-one electrical connection is created between a corresponding pin of the second connector and port of the wiring harness connector. Each pin of the second connector is electrically coupled with a wire running through the interior of the testing apparatus, just as each port of the wiring harness electrically couples to one wire of a plurality of wires of the wiring harness. In this way, electrical signals pass between corresponding wires of the wiring harness and testing apparatus. Each pin of the second connector may extend from an interior of the housing to an exterior of the housing. An outer face of the second connector includes a circular lock 434 positioned at a center of the outer face. The lock is surrounded by the plurality of pins of the second connector. The lock allows the second connector to be locked to a wiring harness. For example, a wiring harness may include a metal shaft, similar to metal shaft 246 that locks into the lock of the second connector. In this way, a secure mating connection may be formed between the second connector and the wiring harness. In an alternate embodiment, the lock may have a different shape other than circular, such as square or oval.

A third connector 436 of the testing apparatus is mounted to the top, second sidewall. Specifically, the third connector is mounted directly to the second sidewall of the housing, where the second sidewall is perpendicular to the first sidewall of the housing. In this way, an outer face of the third connector is perpendicular to an outer face of the second connector. The third connector includes a plurality of test points (e.g., test ports) 437 for testing an electrical signal passing through each wire of the first plurality of wires and the harness wires of the wiring harness. For example, as shown in FIG. 4, a testing probe 438 may couple to (e.g., plug into) one of the testing ports of the third connector. Each testing port corresponds to and couples to one of first plurality of wires of the testing apparatus. An example configuration of the wires of the testing apparatus is shown in FIG. 8, as described further below. The third connector extends outward and away from an outer surface of the second sidewall of the housing. Further, the outer face of the third connector includes a circular lock 440 (similar to lock 434) positioned at a center of the outer face. The lock is surrounded by the plurality of testing points of the third connector. In an alternate embodiment, the lock may have a different shape other than circular, such as square or oval. In yet another embodiment, the outer face of the third connector may not include a circular lock.

As shown in FIGS. 4 and 5, the testing apparatus includes one or more clamps 442 spaced between and coupling together a plurality of groups of the first plurality of wires. The clamps may help to keep the plurality of wires organized and reduce the likelihood of tangling and degradation. Each clamp includes a plurality of planar shelves separating groups of wires of the first plurality of wires from one another. Specifically, as shown in FIGS. 4 and 5, the plurality of shelves are stacked and coupled to one another via a mechanical coupling mechanism, such as a series of bolts and connecting rods running through each of the shelves. In alternate embodiments, an alternate mechanical coupling or clamp mechanism may be used to separate and organize groups of wires in the first plurality of wires extending from the housing to the first connector of the testing apparatus. As shown in FIG. 5, a first clamp 502 is positioned at and coupled to the open third side (e.g., end) 414 of the housing. Thus, the first clamp organizes the first plurality of wires as they exit the housing and extend outwardly and away from the housing to the first connector 404. A second clamp 504 is positioned exterior to the housing between the first clamp and the first connector. In another embodiment, the testing apparatus may include more or less than the two clamps shown in FIG. 5. For example, as a length of the first plurality of wires extending from the housing and to the first connector increases, a larger number of clamps may be used to organize the wires.

As shown in FIG. 5, a first portion 506 of the third connector 436 extends away from an outer surface of the housing. As such, the portion has a height 508 above the second sidewall 412 of the housing. A second portion 510 of the third connector extends into the housing, below the outer surface of the housing. A portion of the plurality of wires within the housing of the testing apparatus couple to dedicated ports within the second portion of the third connector. It should be noted that the second connector may also include a portion that extends into an interior of the housing.

Each wire of the first plurality of wires has a Y configuration with three extension portions. As shown in FIG. 5, a first extension portion 512 extends from inside the housing to the first connector (and is organized into group by the above-described clamps). A second extension portion (not shown in FIG. 5) is positioned within the interior of the housing and extends and couples to the second connector. Further, a third extension portion 514 is positioned within the interior of the housing and extends and couples to the third connector. The second and third extension portions may be positioned (e.g., housed) entirely within an interior of the housing while the first extension portion of each wire extends exterior to the housing and to the first connector.

FIG. 8 shows a schematic of an embodiment of a configuration of one wire 800 of the first plurality of wires of the testing apparatus. Specifically, the schematic shows the first extension portion 512 having a first end 802 that couples directly to a dedicated connection point (e.g., port or pin) of the first connector. The second extension portion 804 has a second end 806 that couples directly to a dedicated connection point of the second connector. The third extension portion 514 has a third end 808 that couples directly to a dedicated connection point of the third connector. As explained above, the second end and third end are interior to the housing of the testing apparatus and the first end extends outside of and away from the housing. All three extension portions share a common end 810 where they are electrically coupled to one another. The common end has a length 812 where each of the first, second, and third extension portions are coupled to one another. In this way, electrical signals may pass through and between all three of the extension portions of the wire via the common end. In one example, the first extension portion and the second extension portion may be referred to as a main wire and the third extension portion may be referred to as a testing wire that is spliced from the main wire. In this way, the main wire electrically couples the first and second connectors to one another and the testing wire electrically couples the third connector to the main wire (and thus the first and second connectors).

Returning to FIG. 5, the second sidewall of the housing includes a lip 516 that extends outward toward the first connector. In this way, the lip extends past the interior portion of the third connector in order to cover and protect the interior portion of the third connector. In alternate embodiments, the second sidewall may be flush with a wall perimeter 518 of the open end.

Turning to FIG. 6, the testing apparatus 400 is shown coupled with an electrical panel 602 and a wiring harness 604. Specifically, the testing apparatus is coupled between and in series with the electrical panel and the wiring harness. The first connector 404 is directly connected to a panel connector 606 of the electrical panel. As shown in FIG. 6, the electrical panel includes multiple panel connectors. The first connector may be adapted to couple to each and any of the multiple panel connectors. The panel connector of the electrical panel may be coupled to a plurality of panel wires within the electrical panel. The second connector 428 of the testing apparatus is coupled directly to a complementary electrical connector 608 of the wiring harness. A plurality of harness wires 610 are electrically and directly coupled with the complementary connector of the wiring harness. Each harness wire of the plurality of harness wires corresponds to one panel wire of the plurality of panel wires. The testing apparatus electrically couples each harness wire to the corresponding panel wire via a corresponding main wire of the testing apparatus that is coupled between the first and second connector of the testing apparatus. A testing wire spliced from each of the main wires within the testing apparatus is then coupled to a corresponding dedicated testing port 437 of the third connector 436. As shown in FIG. 6, a testing probe 438 is coupled to one of the testing ports of the third connector. As such, the electrical signal passing through the corresponding testing wire, main wire, and harness wire may be sampled and analyzed by an external electrical testing apparatus coupled to the testing probe. As shown in FIG. 6, the open side of the housing which the first connector is tethered to and the side of the housing that the second connector is mounted to are in-line and parallel with one another. By positioning the third connector at a top side of the housing of the testing apparatus, such that the top side and an outer face of the third connector are perpendicular to an outer face of the second connector and the open side of the housing, the testing ports of the third connector may be more easily visible and accessible for electrical sampling and testing via the testing probes. As such, testing of the electrical signals passing through the wiring harness may be more easily and quickly assessed, thereby allowing degradation of the wiring harness wires to be detected more easily during operation of the electrical system (e.g., such as operation of a vehicle in which the electrical panel is installed).

FIG. 7 shows another view of the top side (e.g., at the second sidewall 412) of the testing apparatus 400. The plurality of testing ports 437 of the third connector 436 are shown surrounding the lock 440. Further, two testing probes 438 are shown coupled to individual testing ports. FIGS. 4-7 show example configurations with relative positioning of the various components. If shown directly contacting each other, or directly coupled, then such elements may be referred to as directly contacting or directly coupled, respectively, without any components there-between, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example.

FIG. 9 shows a flowchart of an embodiment of a method 900 for monitoring an electrical panel of a vehicle, such as the vehicle and electrical panel shown in FIG. 3. Method 900 may be executed in a system where an electrical testing apparatus (such as the electrical testing apparatus 200 of FIGS. 2-3 and/or 400 of FIGS. 4-7) is coupled directly to and in series with the electrical panel and a wiring harness of the electrical panel, as shown in the embodiments of FIGS. 3 and 6.

Method 900 begins at 902 by passing electrical signals from the electrical panel to a first connector (such as first connector 204 shown in FIGS. 2-3 and/or first connector 404 shown in FIGS. 4-7) of the electrical testing apparatus, through the electrical testing apparatus via a plurality of main wires (such as the first extension portion 512 and second extension portion 804 which may comprise a main wire of the plurality of main wires) connecting the first connector to a second connector (such as the second connector 208 shown in FIGS. 2-3 and/or the second connector 428 shown in FIGS. 4 and 6-7) of the electrical testing apparatus, and to a wiring harness of the electrical panel (such as wiring harness 106 shown in FIGS. 1-3 and/or wiring harness 604 shown in FIG. 6), the wiring harness coupled to the second connector, during operation of the vehicle.

At 904, the method includes splitting the passing electrical signals off to a third connector (such as third connector 210 shown in FIGS. 2-3 and/or third connector 436 shown in FIGS. 4-7) of the electrical testing apparatus, where the third connector is coupled to the plurality of main wires via a second plurality of wires (such as third extension portion 514 shown in FIGS. 5 and 8), each of the second plurality of wires spliced off from a corresponding one of the plurality of main wires.

As introduced above, the plurality of main wires run through an interior of a housing of the electrical testing apparatus, where a first end of each of the plurality of main wires extends outside of and away from the housing and couples to a corresponding connection port of the first connector, and where a second end of each of the plurality of main wires couples to a corresponding connection port of the second connector. The first connector is exterior to and spaced away from the housing and the second connector and the third connectors are directly mounted to the housing.

At 906, the method includes detecting the passing electrical signals. Detecting the passing electrical signals includes detecting a plurality of passing electrical signals, each passing electrical signal of the plurality of electrical signals passing from a corresponding wire of the electrical panel to a corresponding wire of the wiring harness through the electrical testing apparatus. For example, the third connector includes a plurality of testing ports, where each testing port is electrically coupled to a corresponding wire of the electrical panel and the wiring harness via one wire of the second plurality of wires. As such, an external testing apparatus may detect the passing electrical signals through a testing probe coupled to one of the testing ports.

In this way, electrical signals passing through the wiring harness to/from the electrical panel may be detected and analyzed via the electrical testing apparatus coupled between and in series with the electrical panel and wiring harness. As described above, the testing apparatus may be directly coupled to and between each of the wiring harness and electrical panel such that the testing apparatus is the only component positioned between and separating a corresponding panel connector of the electrical panel and the wiring harness. The technical effect of arranging the testing apparatus in series with the wiring harness and electrical panel in this way is allowing electrical testing of the wires of the wiring harness and/or circuits of the electrical panel during operation of the electrical system more quickly and easily and without causing degradation of the wiring harness. For example, by positioning the third connector (e.g., the testing connector) on a side of the housing of the testing apparatus that is arranged perpendicular to the sides of the housing including the second connector and to which the first connector is tethered to, a user may more easily access the third connector for testing purposes. Further, the testing probes connected to the third connector may not interfere with other electrical components of the electrical system (e.g., other wires or wiring harnesses extending from or connected to the electrical panel).

In another embodiment, the second connector of the electrical testing apparatus may be mounted to the housing by way of a plurality of wires, such that the second connector is tethered to the housing by the plurality of wires. For example, the electrical testing apparatus may include a housing, a first connector, a second connector, and a third connector. The first connector is tethered to the housing via a first plurality of wires. The second connector is mounted to the housing and adapted to connect to a wiring harness of an electrical panel, the wiring harness including a second plurality of wires. The third connector is mounted (e.g., directly mounted) to the housing and includes a plurality of test points. The second connector is mounted to the housing by way of a third plurality of wires, such that the second connector is tethered to the housing by the third plurality of wires.

In one embodiment, an electrical testing apparatus comprises a common housing; a first connector tethered to the housing via a first plurality of wires extending away from and coupled within the housing, where the first connector is adapted to connect to an electrical panel; a second connector mounted to the housing and adapted to connect to a wiring harness of the electrical panel, the wiring harness including a second plurality of wires; and a third connector mounted to the housing and including a plurality of test points for testing a respective electrical signal passing through each wire of the second plurality of wires. In one example, the second connector is mounted directly to a first side of the housing and the third connector is mounted directly to a second side of the housing. Further, the first plurality of wires may extend away from a third side of the housing, where the third side is opposite the first side. In yet another example, the second side is a top side of the housing and wherein an outer face of the third connector is perpendicular to an outer face of the second connector. Additionally or alternatively, only the second connector and the third connector are mounted directly on the housing and the first connector is spaced away from and tethered to the housing via the first plurality of wires. In one embodiment, each wire of the first plurality of wires has a Y configuration, where a first end of each wire is coupled to the first connector, a second end of each wire is coupled to the second connector, and a third end of each wire is coupled to the third connector, where the second end and third end are interior to the housing and the first end extends outside of and away from the housing. Further, in an embodiment the housing is a fully enclosed housing except for a single open end, wherein the first plurality of wires extend out of the housing from the single open end to the first connector. In any or all of the above embodiments, the electrical testing apparatus may include one or more clamps spaced between and coupling together a plurality of groups of the first plurality of wires. For example, in one embodiment, the one or more clamps includes at least a first clamp and a second clamp, the first clamp being positioned at and coupled to an open end of the housing from which the first plurality of wires extends out of the housing and the second clamp being positioned exterior to the housing between the first clamp and the first connector. In one example, a first side of the first connector is adapted to couple to a panel connector of the electrical panel and the electrical testing apparatus further comprises a metal shaft extending from a second side of the first connector, opposite the first side, where the metal shaft is adapted to lock the first connector into the panel connector. In another example, an outer face of the second connector and an outer face of the third connector each include a lock positioned at a center of the outer face and surrounded by a plurality of connector connection points. In yet another example, the first connector is configured to connect to an engine control unit panel, a consolidated input/output panel, and a traction controller panel, each of the panels having a respective common panel connector comprising a first number of wire connections, and the second connector is configured to connect to the wiring harness, the wiring harness comprising the first number of wires. In one example, when the panel is the consolidated input/output panel or the fraction controller panel, the first number of wire connections is 62 and the first number of wires is 62. In another example, when the panel is the engine control unit, the first number of wire connections is 37 and the first number of wires is 32. In an alternate example, each of the panels comprises a different number of wire connections than 62 of 37 wires and the wiring harness comprises a same number of wires.

In another embodiment, a system for monitoring an electrical system of a vehicle comprises an electrical panel including a first connector coupled to a plurality of panel wires; a wiring harness including a plurality of harness wires coupled to a second connector adapted to couple to the first connector, where each harness wire of the plurality of harness wires corresponds to one panel wire of the plurality of panel wires; and a testing apparatus including a third connector coupled to the first connector, a fourth connector coupled to the second connector, and a fifth connector including a plurality of testing ports, each port of the plurality of testing ports coupled to a testing wire spliced from a corresponding main wire of a plurality of main wires of the testing apparatus coupling the third connector to the fourth connector, where each main wire corresponds to a corresponding panel wire and harness wire, and where the third connector and second connector are directly mounted to a housing of the testing apparatus and the first connector is tethered to the housing via the plurality of main wires. As one example, the third connector is directly mounted to a top side of the housing, the first connector is tethered to a first side of the housing, and the second connector is directly mounted to a second side of the housing, where the second side is opposite the first side relative to the top side. As another example, the electrical panel is one or more of an Engine Control Unit (ECU) panel, a consolidated input/output panel (CIO), or a DC or other traction controller panel of the vehicle. In one embodiment, the vehicle is a locomotive.

As used herein, an element or step recited in the singular and proceeded with the word "a" or "an" should be understood as not excluding plural of said elements or steps, unless such exclusion is explicitly stated. Furthermore, references to "one embodiment" of the invention do not exclude the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical testing apparatus, comprising:
   a common housing;
   a first connector tethered to the housing via a first plurality of wires extending away from and coupled within the housing, where the first connector is adapted to connect to an electrical panel;
   a second connector mounted to the housing and adapted to connect to a wiring harness of the electrical panel, the wiring harness including a second plurality of wires; and
   a third connector mounted to the housing and including a plurality of test points for testing a respective electrical signal passing through each wire of the second plurality of wires.

2. The apparatus of claim 1, wherein the second connector is mounted directly to a first side of the housing and the third connector is mounted directly to a second side of the housing.

3. The apparatus of claim 2, wherein the first plurality of wires extend away from a third side of the housing, where the third side is opposite the first side.

4. The apparatus of claim 3, where the second side is a top side of the housing and wherein an outer face of the third connector is perpendicular to an outer face of the second connector.

5. The apparatus of claim 1, wherein only the second connector and the third connector are mounted directly on the housing and the first connector is spaced away from and tethered to the housing via the first plurality of wires.

6. The apparatus of claim 1, wherein each wire of the first plurality of wires has a Y configuration, where a first end of each wire is coupled to the first connector, a second end of each wire is coupled to the second connector, and a third end of each wire is coupled to the third connector, where the second end and third end are interior to the housing and the first end extends outside of and away from the housing.

7. The apparatus of claim 1, wherein the housing is a fully enclosed housing except for a single open end, wherein the first plurality of wires extend out of the housing from the single open end to the first connector.

8. The apparatus of claim 1, further comprising one or more clamps spaced between and coupling together a plurality of groups of the first plurality of wires.

9. The apparatus of claim 8, wherein the one or more clamps comprises at least a first clamp and a second clamp, the first clamp being positioned at and coupled to an open end of the housing from which the first plurality of wires extends out of the housing and the second clamp being positioned exterior to the housing between the first clamp and the first connector.

10. The apparatus of claim 1, wherein a first side of the first connector is adapted to couple to a panel connector of the electrical panel and further comprising a metal shaft extending from a second side of the first connector, opposite the first side, where the metal shaft is adapted to lock the first connector into the panel connector.

11. The apparatus of claim 1, wherein an outer face of the second connector and an outer face of the third connector each include a lock positioned at a center of the outer face and surrounded by a plurality of connector connection points.

12. The apparatus of claim 1, wherein the first connector is configured to connect to an engine control unit panel, a consolidated input/output panel, and a traction controller panel, each of the panels having a respective common panel connector comprising 62 or 37 wire connections, and the second connector is configured to connect to the wiring harness, the wiring harness comprising 62 or 37 wires.

13. A method for monitoring an electrical panel of a vehicle, comprising:
   passing electrical signals from the electrical panel to a first connector of an electrical testing apparatus, through the electrical testing apparatus via a first plurality of wires connecting the first connector to a second connector of the electrical testing apparatus, and to a wiring harness of the electrical panel, the wiring harness coupled to the second connector, during operation of the vehicle; and
   splitting the passing electrical signals off to a third connector of the electrical testing apparatus, where the third connector is coupled to the first plurality of wires via a second plurality of wires, each of the second plurality of wires spliced off from a corresponding one of the first plurality of wires.

14. The method of claim 13, wherein the first plurality of wires run through an interior of a housing of the electrical testing apparatus, wherein a first end of each of the first plurality of wires extends outside of and away from the housing and couples to a corresponding connection port of the first connector, and wherein a second end of each of the first plurality of wires couples to a corresponding connection port of the second connector.

15. The method of claim 14, wherein the first connector is exterior to and spaced away from the housing and wherein the second connector and the third connector are directly mounted to the housing.

16. The method of claim 13, wherein the third connector includes a plurality of testing ports, where each testing port is electrically coupled to a corresponding wire of the electrical panel and the wiring harness via one wire of the second plurality of wires.

17. The method of claim 13, further comprising detecting the passing electrical signals, where detecting the passing electrical signals includes detecting a plurality of passing electrical signals, each passing electrical signal of the plurality of electrical signals passing from a corresponding wire of the electrical panel to a corresponding wire of the wiring harness through the electrical testing apparatus.

18. A system for monitoring an electrical system of a vehicle, comprising:
an electrical panel including a first connector coupled to a plurality of panel wires;
a wiring harness including a plurality of harness wires coupled to a second connector adapted to couple to the first connector, where each harness wire of the plurality of harness wires corresponds to one panel wire of the plurality of panel wires; and
a testing apparatus including a third connector coupled to the first connector, a fourth connector coupled to the second connector, and a fifth connector including a plurality of testing ports, each port of the plurality of testing ports coupled to a testing wire spliced from a corresponding main wire of a plurality of main wires of the testing apparatus coupling the third connector to the fourth connector, where each main wire corresponds to a corresponding panel wire and harness wire, and where the third connector and second connector are directly mounted to a housing of the testing apparatus and the first connector is tethered to the housing via the plurality of main wires.

19. The system of claim 18, wherein the third connector is directly mounted to a top side of the housing, the first connector is tethered to a first side of the housing, and the second connector is directly mounted to a second side of the housing, where the second side is opposite the first side relative to the top side.

20. The system of claim 18, wherein the electrical panel is one or more of an engine control unit panel, a consolidated input/output panel, or a traction controller panel of the vehicle.

21. The system of claim 20, wherein the vehicle is a locomotive.

\* \* \* \* \*